(12) United States Patent
Aizawa et al.

(10) Patent No.: US 10,060,021 B2
(45) Date of Patent: Aug. 28, 2018

(54) THIN-FILM FORMATION METHOD, THIN-FILM FORMATION DEVICE, OBJECT TO BE PROCESSED HAVING COATING FILM FORMED THEREOF, DIE AND TOOL

(71) Applicant: Shibaura Institute of Technology, Tokyo (JP)

(72) Inventors: Tatsuhiko Aizawa, Tokyo (JP); Hiroshi Morita, Tokyo (JP); Shuichi Kurosumi, Tokyo (JP)

(73) Assignee: Shibaura Institute of Technology, Tokyo (JP)

( * ) Notice: Subject to any disclaimer, the term of this patent is extended or adjusted under 35 U.S.C. 154(b) by 364 days.

(21) Appl. No.: 14/346,898

(22) PCT Filed: Sep. 20, 2012

(86) PCT No.: PCT/JP2012/005957
§ 371 (c)(1),
(2) Date: Aug. 4, 2014

(87) PCT Pub. No.: WO2013/042355
PCT Pub. Date: Mar. 28, 2013

(65) Prior Publication Data
US 2014/0377472 A1  Dec. 25, 2014

(30) Foreign Application Priority Data
Sep. 22, 2011  (JP) .................. 2011-208140

(51) Int. Cl.
C23C 14/00 (2006.01)
C23C 14/06 (2006.01)
(Continued)

(52) U.S. Cl.
CPC ........ *C23C 14/0605* (2013.01); *C23C 14/345* (2013.01); *C23C 14/351* (2013.01)

(58) Field of Classification Search
USPC .............. 438/530; 148/103; 204/192.12
See application file for complete search history.

(56) References Cited

U.S. PATENT DOCUMENTS

| | | | | |
|---|---|---|---|---|
| 3,856,579 A | * | 12/1974 | Allen | H01F 10/126 148/103 |
| 6,361,667 B1 | | 3/2002 | Kobayashi et al. | |

(Continued)

FOREIGN PATENT DOCUMENTS

| | | |
|---|---|---|
| CN | 101597750 A | 12/2009 |
| JP | 09324273 A | 12/1997 |

(Continued)

OTHER PUBLICATIONS

International Search Report in International Application No. PCT/JP2012/005957, filed Sep. 20, 2012.

*Primary Examiner* — Timon Wanga
(74) *Attorney, Agent, or Firm* — Saliwanchik, Lloyd & Eisenschenk

(57) ABSTRACT

[Problem] To provide a means for forming a thin-film in a desired part of an object to be treated. [Solution] The thin-film formation means according to the present invention is part of a thin-film formation method which supplies electricity to a raw-material gas in a reduced pressure container, converting the raw-material gas to plasma, and irradiates the plasma, thus forming a thin-film on the surface of an object to be treated. Therein, the effect of a magnetic field generated by a magnetic field generating means is used to form the thin-film in a desired part. The effect of the magnetic field focuses the flux of the plasma in a desired part of the surface of the object to be treated, thus enabling the thin-film to be formed in the desired part.

3 Claims, 3 Drawing Sheets

(51) Int. Cl.
    *C23C 14/34*     (2006.01)
    *C23C 14/35*     (2006.01)

(56) References Cited

U.S. PATENT DOCUMENTS

| | | | |
|---|---|---|---|
| 6,579,421 B1* | 6/2003 | Fu | C23C 14/32 204/192.12 |
| 2008/0108210 A1* | 5/2008 | Parihar | C23C 14/02 438/530 |
| 2010/0270143 A1 | 10/2010 | Kikuchi et al. | |
| 2012/0097527 A1 | 4/2012 | Kodaira et al. | |

FOREIGN PATENT DOCUMENTS

| JP | 1998-259480 A | 9/1998 |
|---|---|---|
| JP | 001-295081 A | 10/2001 |
| JP | 2005-197280 A | 7/2005 |
| JP | 2006-307243 A | 11/2006 |

\* cited by examiner

THIN-FILM FORMATION METHOD, THIN-FILM FORMATION DEVICE, OBJECT TO BE PROCESSED HAVING COATING FILM FORMED THEREOF, DIE AND TOOL

CROSS-REFERENCE TO RELATED APPLICATIONS

This application is the U.S. national stage application of International Patent Application No. PCT/JP2012/005957, filed Sep. 20, 2012, which claims priority to Japanese Application No. 2011-208140, filed Sep. 22, 2011, the disclosures of each of which are incorporated herein by reference in their entirety.

TECHNICAL FIELD

The present invention relates to a method of forming a thin-film of DLC (Diamond Like Carbon) on a part or whole surface of an object including a die, a tool or the like made of a partly or fully magnetizable material, a thin-film formation device, and an object to be processed (a die or a tool) having a coating film formed thereof.

BACKGROUND ART

A representative one of thin-films is a DLC thin-film. The DLC thin-film is an abbreviation of a Diamond Like Carbon film, and refers to a carbon film having physical properties like diamond, e.g., having high hardness. In the related art, a DLC coating using the DLC thin-film has been widely used as a protective thin-film for a variety of dies or tools. In this case, the DLC thin-film can be easily formed on the die or the tool depending on its type, shape and size, but may be very difficult to be formed. On a surface of the die or a surface adjacent to a tip of the tool, the DLC thin-film is easily formed. On the other hand, on an inner peripheral wall facing to an outer peripheral wall of a punch used for drawing, for example, the DLC thin-film is very difficult to be formed.

However, even though it is difficult to be formed, it is often necessary to form the DLC thin-film. In particular, as to a progressive die for drawing or a transfer mold die, there are a number of dies each having a die inner peripheral wall having a small inside diameter. In order to assure soundness of a whole die for a prolonged period, it is essential that the DLC thin-film is formed on the die inner peripheral wall.

In the meantime, as a device for forming the DLC thin-film, there is a sputtering device for forming a film (hereinafter may be referred to as "a first device in the related art") characterized in that it comprises a magnet mechanism for setting a magnetic field that leads ionized sputter particles to an object to be processed; the sputter particles being ionized in plasma formed in an ionizing space between a target and an object holder (Patent Document 1). A sputtering device for forming a film (hereinafter referred to as "a second device in the related art") characterized in that it comprises a magnet mechanism disposed at a rear side surface viewed from a target is also known (Patent Document 2). An object of the first device in the related art or the second device in the related art is to prevent plasma from diffusing by the action of the magnetic field, thereby arriving high density plasma at the object.

Patent Document 1: Japanese Patent Application Laid-open No. 2006-307243 (paragraph 0037, FIGS. 1 and 2)
Patent Document 2: Japanese Patent Application Laid-open No. Hei10-259480 (paragraphs 0047 to 0050, FIG. 5)

Although the first device in the related art or the second device in the related art can increase the density of the plasma, it cannot fully meet the needs that the thin-film is formed on a die inner peripheral wall having a small inside diameter or an inner periphery of a tool having a small diameter hole. Because simply increasing the density is insufficient in order to reach plasma within the small diameter hole, in particular to deeper positions, an aggressive means for converging and leading the plasma at a desired area is necessary.

SUMMARY OF INVENTION

Problem to be Solved by the Invention

A problem to be solved by the invention is to provide a method of forming a thin-film, a thin-film formation device, and a die or a tool having a coating film formed thereof in which a thin-film can be formed not only on a flat plate shaped outer surface but also on a peripheral wall of the small diameter hole based on the related art device for an object to be processed having a flat plate shape as described above. The details will be described later. The term definition for describing any of the claimed inventions will be also applied to the other claimed inventions as long as it is within the possible range in view of the nature despite a different in an invention category or the description orders.

Means for Solving the Problem

According to the present invention, a method of forming a thin-film by feeding electricity to a raw material gas containing components for forming the thin-film to be intended in a reduced pressure container to plasmanize the raw material gas and to feed the raw material gas to an object to be processed is characterized in that a step of converging a flux of the plasma to a desired area of the object by controlling a magnetic field with a magnetic field generation means is included. The thin-film may be directly formed on a surface of a magnetizable area, or may be indirectly formed via an intermediate layer formed on the surface in advance. The plasma refers to ionized gas containing ions together with electrons and neutral particles. It is possible to place an ionizing means (for example, a device for feeding high frequency electricity) in order to promote ionization of plasma or to use an auxiliary gas or a carrier gas for promoting plasmanization. Here, the desired area refers to an area where the plasma is intentionally converged within the entire area of the object. The material of the object includes metal (may have magnetism or may have no magnetism), ceramic, resin or a composite material thereof, or all materials that can form a thin-film other than the above. The shape of the object may be free, and may be flat, curved, concave or convex or may have a through hole or have no through hole. The desired area may be set without limitation. For example, a flat or curved surface of the object, an inner wall or bottom of a concave part or tip of a convex part of the object, or an inner wall of a through hole of the object can be set entirely or partly as the desired area.

According to the method of forming a thin-film, the raw material gas is plasmanized by feeding electricity, and the flux of the plasma generated is converged at the desired area of the object by controlling the magnetic field. At this time, the components for forming the thin-film contained in the plasma are excited and accumulated at the desired area, thereby forming a thin-film. As the plasma can be converged at the desired area, the plasma can reach the area where the plasma is difficult to reach in the related art. As a result, the thin-film is formed effectively and evenly on the peripheral wall of a small diameter hole formed on the object as well as a flat surface and a peripheral wall of a large diameter hole.

In the method of forming a thin-film, as the magnetic field generation means, a magnet and an electromagnet can be used.

According to the method, the magnet can be easily placed without requiring power source, and the electromagnet can provide a desired magnetic field by controlling current carrying.

According to the method, the magnetic field generation means may be disposed at least either of a feed side of the raw material gas at the object and a rear side of the desired area at the object.

The method allows to easily converge the plasma flux at the desired area of the object.

According to the method of forming a thin-film, magnetic field generation means is disposed facing to the object in a raw material gas feed space.

As the magnetic field generation means is disposed in the space facing to the object, it is expected to converge plasma bloom and to promote ionization. A position disposed is not especially limited, and can be selected as appropriate depending on a method of feeding the raw material gas and desired properties of the thin-film.

According to the method of forming a thin-film, the magnetic field generation means is the object at least partially magnetized.

In the above-described method, at least the magnetizable area of the object is magnetized, whereby the magnetizable area itself functions to converge the plasma.

According to the method of forming a thin-film, the magnetic field generation means may include the object at least partially magnetized and at least either of the magnet and the electromagnet.

In the above-described method, the plasma is converged by at least either of the magnet and the electromagnet disposed at the position together with the magnetized object.

According to the method of forming a thin-film, the magnet and the electromagnet may be disposed at least either of the feed side of the raw material gas at the object and the rear side of the desired area at the object.

The method allows to control the magnetic field on at least either of front or rear surface of the object.

According to the method of forming a thin-film, the magnet and the electromagnet may be disposed facing to the object in the raw material gas feed space.

In the above-described method, as the magnetic field generation means faces to the object, the plasma can be easily fed.

According to the present invention, a thin-film formation device, comprises a reduced pressure container having an exhaust system; a raw material gas feed means for feeding a raw material gas containing components for forming a thin-film to be intended into the reduced pressure container; a plasma generation means for generating plasma from the raw material gas fed from the raw material gas feed means; and a magnetic field generation means for converging a flux of the plasma to a desired area of the object by controlling a magnetic field. An operating principle of the plasma generation means is not limited. For example, it may be a PVD (Physical Vapor Deposition) method, a CVD (Chemical Vapor Deposition) method, and an intermediate method thereof. Furthermore, the operating principal can involve all methods of forming a film that can generate plasma despite of the names.

According to the thin-film formation device, the flux of the plasma generated form the raw material gas is converged at the desired area of the object by controlling the magnetic field with the magnetic field generation means. At this time, the components for forming the thin-film contained in the plasma are excited and accumulated at the desired area, thereby forming a thin-film. As the plasma can be converged at the desired area, the plasma can reach the area where the plasma is difficult to reach in the related art. As a result, the thin-film is formed effectively and evenly on the peripheral wall of a small diameter hole formed on the object as well as a flat surface and a peripheral wall of a large diameter hole.

The magnetic field generation means may include at least either of magnet and electromagnet.

According to the device, the magnetic field for controlling the plasma is generated at at least either of the magnet or the electromagnet. The magnet can be easily placed without requiring power source, and the electromagnet can provide a desired magnetic field by controlling current carrying.

According to the thin-film formation device, the magnetic field generation means may be disposed at least either of a feed side of the raw material gas at the object and a rear side of the desired area at the object.

In the above-described device, the plasma is converged by at least either of the magnet and the electromagnet disposed at the position.

According to the thin-film formation device, magnetic field generation means may be disposed at least either of a feed side of the raw material gas at the object and a rear side of the desired area at the object.

In the above-described device, the magnetic field is controlled at the position.

According to the thin-film formation device, magnetic field generation means may be disposed facing to the object in a raw material gas feed space.

In the above-described device, as the magnetic field generation means faces to the object, the plasma is easily fed.

According to the thin-film formation device, the magnetic field generation means may be the object at least partially magnetized.

In the above-described device, the magnetizable area is magnetized, whereby the magnetizable area itself functions to converge the plasma.

According to the thin-film formation device, the magnetic field generation means may include the object at least partially magnetized and at least either of the magnet and the electromagnet.

In the above-described device, the plasma is converged by at least either of the magnet and the electromagnet disposed at the position.

According to the thin-film formation device, the magnet and the electromagnet may be disposed at least either of the feed side of the raw material gas at the object and the rear side of the desired area at the object.

The device allows to control the magnetic field on at least either of front or rear surface of the object.

According to the thin-film formation device, the magnetic field generation means may be disposed facing to the object in the raw material gas feed space.

In the above-described device, as the magnetic field generation means faces to the object, the plasma can be easily fed.

According to the present invention, an object to be processed comprises a thin-film formed by the above-described method of forming a thin-film.

By the above-described object, as the thin-film is formed by plasma convergence, it is possible to easily form the thin-film with good bonding properties. In particular, the thin-film is formed on a through hole and a peripheral wall of a concave part. Although it depends on a depth, a bore, a shape or the like of the through hole and the concave part, the thin-film is formed on the through hole and a deep portion of the peripheral wall of the concave part, in some cases, on a bottom of the concave part that is not possible in the related art. Such a die is very suitable for drawing where a cup shape is press formed from a metal flat plate utilizing the through hole and the concave part.

The object may be a die or a tool.

By the above-described die or tool, as the thin-film is formed by plasma convergence, the thin-film is formed on a through hole and a peripheral wall of a concave part. Although it depends on a depth, a bore, a shape or the like of the through hole and the concave part, the thin-film is formed on the through hole and a deep portion of the peripheral wall of the concave part, in some cases, on a bottom of the concave part that is not possible in the related art. Such a die or tool is very suitable for drawing where a cup shape is press formed from a metal flat plate utilizing the through hole and the concave part.

Effect of the Invention

According to the present invention, it is possible to easily form a thin-film with good bonding properties on a peripheral wall of a small diameter hole by plasma convergence. It is therefore possible to effectively prevent a die or tool where other member is required to be slid against the peripheral wall of the small diameter hole from breaking and wearing. In addition, when other member is slid against a magnetizable area where the thin-film is formed, a sliding friction generated between the member and the thin-film can be effectively decreased.

MODE(S) FOR CARRYING OUT THE INVENTION

Figure 1:
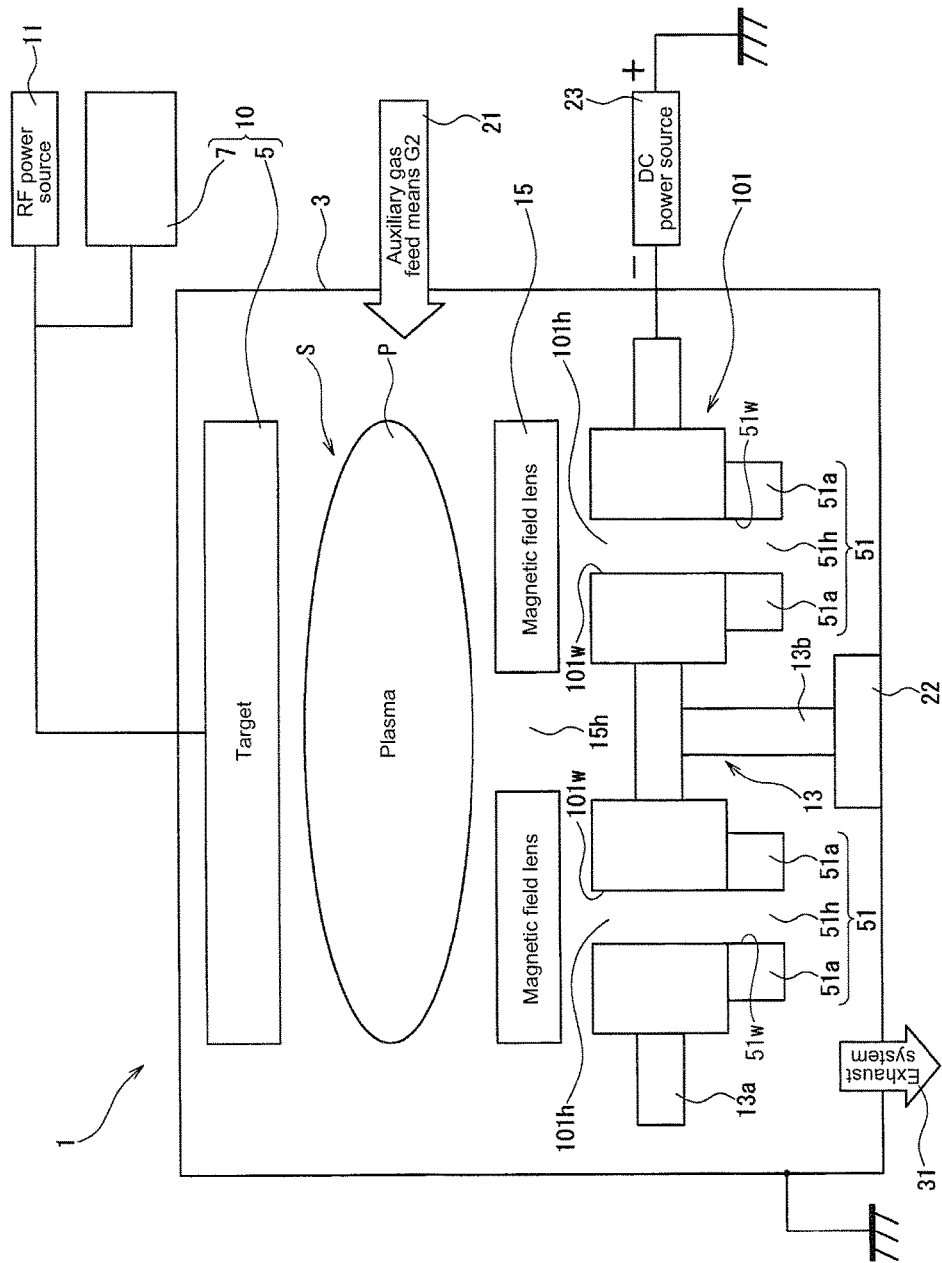
FIG. 1 A front schematic view illustrating a configuration of a thin-film formation device according to the present embodiment.

Hereinafter, an embodiment according to the present invention (hereinafter referred to as "the present embodiment" as appropriate) will be described. In the present embodiment, a thin-film formation device for forming a DLC thin-film at a desired area of an object to be processed and a method of forming the thin-film will be described. Here, the thin-film formation device according to the present embodiment will be firstly described, and a method of forming the thin-film carried out by using the film formation device will be then mentioned.

(Schematic Structure of Thin-Film Formation Device)

A thin-film formation device 1 according to the present embodiment includes a reduced pressure container 3 having an exhaust system 31, a gas feed means 21 for feeding a given gas (a raw material gas containing components for forming the thin-film to be intended) into the reduced pressure container 3, a plasma generation means 10 for generating plasma from the raw material gas fed from a raw material gas feed means fed by the gas feed means 21, a target 5 disposed within the reduced pressure container 3, a sputtering light source 7 for sputtering the target 5, an ionizing mechanism 11 for ionizing sputtering particles discharged from the target 5 by sputtering, an object holder 13 for holding objects to be processed 101 at positions where the sputtering particles ionized are incident, and magnetic field lenses (ring-shaped magnet) 15 for converging the particles (plasma) discharged from the target 5 at the desired area. The target 5 and the sputtering light source 7 configure the plasma generation means 10 according to the present embodiment. The ionizing mechanism 11 and the magnetic field lenses 15 may be omitted if unnecessary.

(Reduced Pressure Container)

The reduced pressure container 3 is an air-tight container composed of metal such as stainless steel and includes a gate valve (not shown). The reduced pressure container 3 is electrically grounded. The exhaust system 31 is configured of a multi-stage vacuum exhaust system having a turbo molecular pump, a diffusion pump or the like (not shown). The reduced pressure container 3 can be evacuated to about $10^{-8}$ Torr. The exhaust system 31 includes an exhaust velocity regulator (not shown) such as variable orifices.

(Target)

The target 5 is selected depending on the kind of the thin-film to be formed, is a circular plate shaped carbon target having, for example, a thickness of 10 mm and a diameter of about 100 mm, and is attached to the reduced pressure container 3 via an insulator (not shown). A front face (a lower face in FIG. 1) of the target 5 is disposed facing to the objects 101, and the sputtering light source 7 applies a negative pressure of about 100V to the target 5. Although not used in this embodiment, a back face magnet mechanism (not shown) may be disposed on a back face of the target 5 to carry out magnetron sputtering. In this embodiment, the carbon target is used, but the target is not limited thereto. The shape, the attached position or the like of the target can be selected as appropriate depending on the situation. Also, the sputtering light source can be freely set within a suitable range of the target selected.

(Gas Feed Means)

The gas feed means 21 is configured of a gas cylinder, a valve or the like (not shown) where a sputtering discharge gas including argon (Ar) (or may be nitrogen ($N_2$), oxygen ($O_2$), xenon (Xe) or the like) is pooled. Argon is an auxiliary gas G2 for aiding plasmanization of the raw material gas G1. In this embodiment, the raw material gas G1 is composed of carbon particles sputtered from the target 5.

(Ionizing Mechanism)

The ionizing mechanism 11 in this embodiment generates high frequency plasma in a raw material gas feed space S that is set as a passing path of carbon ions from the target 5 to the objects 101. In this embodiment, the ionizing mechanism 11 is a high frequency light source connected to the target 5. Desirably, the high frequency light source outputs about 500 W at a frequency of 13.56 MHz, for example. By the high frequency light source, a high frequency electric field is formed in the raw material gas feed space via the object holder 13. The gas fed by the gas feed means 21 is plasmanized by the high frequency electric field to form plasma P. Upon passing through the plasma P, the gas is collided with electrons or ions in the plasma P and is ionized.

(Object Holder)

A symbol 13 shown in FIG. 1 is the object holder. The object holder 13 is entirely made of metal, and includes a holder 13a for directly holding the objects 101 physically and electrically, and a support 13b connected to the holder 13a at one end. Other end of the support 13b is landed on the reduced pressure container 3 via an insulator 22, thereby supporting the objects 101 together with the object holder 13 within the reduced pressure container 3. A land position of the object holder 13 is set such that the land position is positioned at an incident position of plasma converged at the desired area of the objects 101 and held. A negative DC bias is desirably applied to the object holder 13 by DC power source 23. The negative DC bias is applied to the objects 101 and ions in the plasma p are attracted, which contributes to promotion of the thin-film formation.

(Configuration of Object)

The objects 101 are dies in this embodiment. The objects 101 include a plurality of through holes 101h (two in this embodiment) each having a circle section surrounded by a peripheral wall 101w. Through holes 101h penetrate through the object holder 13 along a convergence direction (vertically in FIG. 1) of the plasma. In this embodiment, the peripheral walls 101w of the through holes 101h around inlets open to the plasma direction are set to the desired area where the thin-film is to be formed. Although the dies are an example of the objects 101 in this embodiment, all requiring the thin-film formation may be the objects other than the tool. The thin-film can be suitably formed on the objects having recesses in addition to or instead of the through holes.

(Magnetic Field Lens)

Each symbol 15 shows a magnetic field lens for accelerating carbon particles ionized in the plasma P. The magnetic field lenses 15 used in this embodiment are each a ring magnet having a circle opening 15h in the center. The magnetic field lenses 15 function to accelerate the ions by the self-generated electric field so that the ions effectively reach the objects 101. The embodiments of the magnetic field lenses 15 are not limited to the ring shapes. Other embodiments of the magnet may be used. Means other than a magnet for the same purpose may be used. Note that electromagnets (not shown) may be disposed instead of the ring magnets 15 or in addition to the ring magnets. If the magnetic field lenses 15 are unnecessary, it may be omitted.

(Configuration of Magnet Mechanism)

Each magnet mechanism 51 is configured of a ring-shaped permanent magnet. Specifically, each magnet mechanism 51 includes a circle magnet main body 51a surrounding a peripheral of a central opening 51h separated by a peripheral wall 51w. An outside diameter of each magnetic main body 51a is larger than an outside diameter of each through hole 101h (each peripheral wall 101w). An inside diameter of each peripheral wall 51w is almost the same as or is slightly larger than an inside diameter of each peripheral wall 101w. The magnet mechanisms 51 are the magnet for magnetizing the objects 101, and can be removed from the objects 101. Whether or not the magnet mechanisms 51 are removed, the objects 101 remain partly magnetized. Although the magnet mechanisms 51 are disposed behind the desired area of the objects 101 (the peripheral walls 101w of the through holes 101), the magnet mechanisms 51 may also be disposed at a raw material gas feed side of the desired area, or may be disposed only at the raw material gas feed side of the desired area.

(Method of Forming Thin-Film)

Here, a method of forming a thin-film on a surface of the object using the thin-film formation device 1 will be described. The method of forming the thin-film according to the present invention by feeding a raw material gas containing components for forming the thin-film to be intended with electricity (in this embodiment, high frequency electricity) in a reduced pressure container to plasmanize the raw material gas and by feeding the raw material gas to an object to be processed (in this embodiment, a die including a through hole), includes a step of converging a flux of the plasma to the desired area (in this embodiment, the peripheral walls 101w of the through holes 101h) of the objects by controlling a magnetic field with a magnetic field generation means.

The raw material gas G1 is formed of carbon particles sputtered by sputtering the carbon target 5, i.e., inside generating gas. In order to accelerate a plasma chemical reaction, one or more of argon, nitrogen, oxygen and xenon can be used as the auxiliary gas G2, as appropriate.

Figure 3:
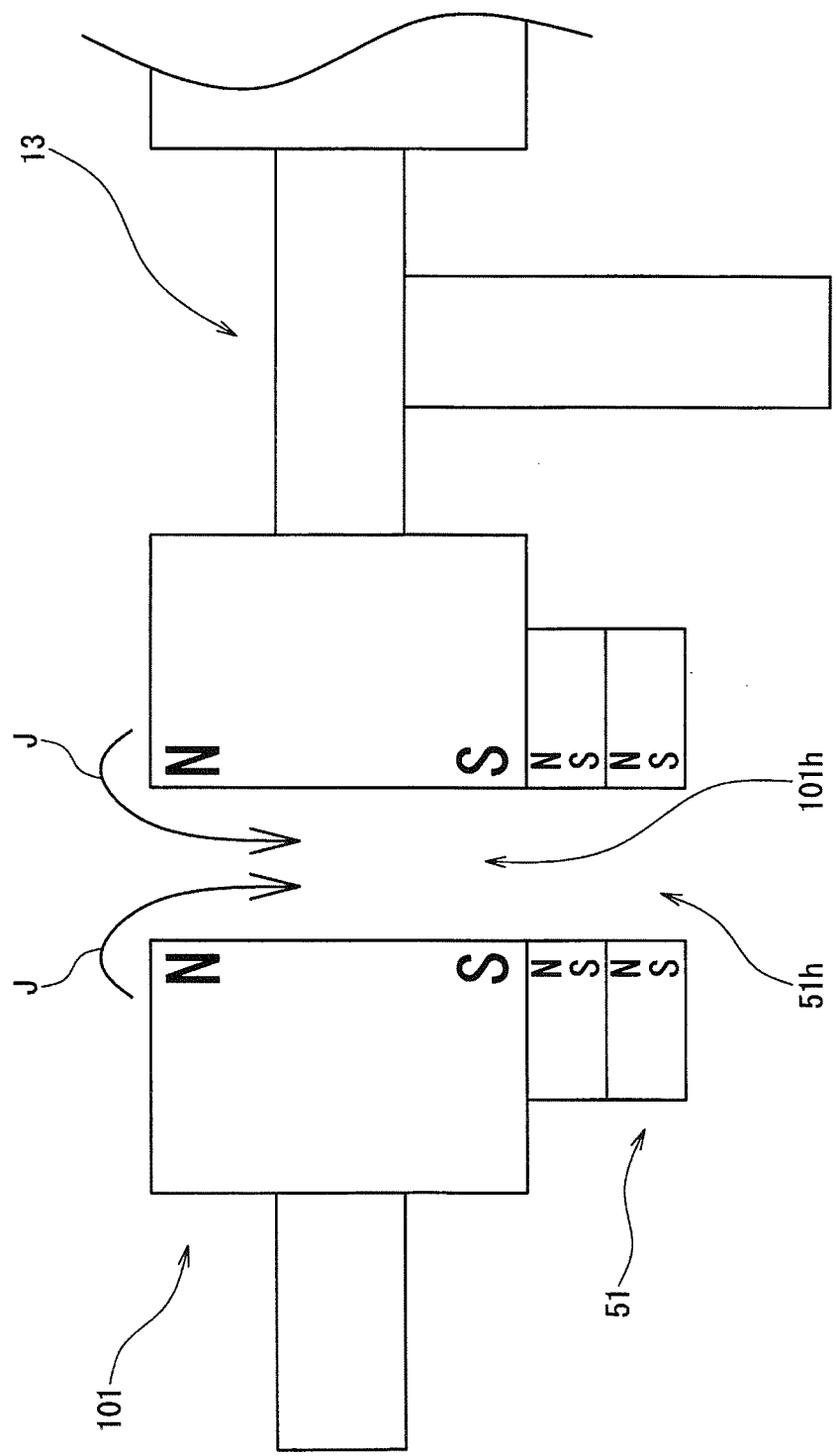
FIG. 3 A partial enlargement view showing around an object to be processed in the thin-film formation device shown in FIG. 1.

Here, the magnet (may be the electromagnet) is attracted to the objects outside (or inside) of the reduced pressure container 3. Specifically, the magnet mechanisms 51 are attracted at rear surfaces of the objects 101 (at the desired area) as viewed from a feed side of the raw material gas, thereby controlling the magnetic field to converge the flux of the plasma to the desired area. Instead of the rear sides at the desired area, the magnet mechanism 51 may be provided at the feed side of the raw material gas, or at both rear and feed sides. Attraction positions by the magnet mechanisms 51 desirably surround the through holes 101h in order to converge the plasma inside of the through holes 101h where the plasma (ion) is very difficult to reach. A magnetization direction in this embodiment is set so that magnetic lines of the objects 101 magnetized direct from the plasma generation means 10 to the through hole 101h, i.e., so that an area nearer the plasma generation means 10 is an N pole and an area farther from the plasma generation means 10 is an S pole (see FIG. 3), or vice versa. By narrowing effect of the ring magnet, the magnetic lines J are converged within each through hole 101h so that the more sputter (ion) can be guided within each through hole 101h. Next, the objects 101 to which the magnet mechanisms 51 are attracted are placed within the reduced pressure container 3 and are held by the object holder 13. Thereafter, a door (not shown) of the reduced pressure container 3 is closed and sealed.

Then, a vacuum exhaust system (not shown) is driven to reduce the pressure of the container 3, and the auxiliary gas G2 is fed to the reduced pressure container 3 from the gas feed means 21. Here, the plasma P is generated within the reduced pressure container 3 to feed the plasma P (ions included therein) to the object 101. The magnetic field lens 15 converges the plasma P at the desired area of the objects 101.

A magnetic field control by any of the ring magnets 15, the magnet mechanisms 51 and the objects 101 at least partially magnetized or in combination thereof converge the plasma P at the desired area of the objects 101 and the ions included in the plasma P are sucked. The ions sucked are accumulated on the surfaces of the objects 101 to form the thin-film. The ions are sucked also by the peripheral walls 101w of the through holes 101h included by the objects 101. As a result, the plasma P (ion) is accumulated on the peripheral walls 101w within the reach where the thin-film is formed.

As described above, the raw material gas G1 according to the present embodiment is generated by sputtering the carbon target 5. Alternatively, the raw material gas G1 may be gas fed from outside to the reduced pressure container 3, i.e., an inner feed gas. Both of inner generation gas and the inner feed gas may be used.

Example

Hereinafter, by the above-described method of forming a thin-film using the thin-film formation device 1, the thin-film formation on the objects will be described. The objects 101 were transfer mold dies for drawing male snap buttons. In each die, two through holes 101h (each having a diameter of 4 mm) were formed to receive protrusions of the snap buttons. The target 3 was the carbon target.

Firstly, on rear side surfaces (a rear side surface viewed from the target 5) of the dies (the objects 101), the ring magnet (the magnet mechanism 51) was attracted to surround each through hole 101h. At this time, at least a part of the dies was magnetized. The ring magnet was 300 mT samarium cobalt magnet having an outside diameter of 24 mm, an inside diameter of 8 mm and a height of 9 mm including an N pole and an S pole in each thickness direction. Two pieces of the magnets were laminated in the thickness direction. When magnetized, the N pole appeared at an area of the die closer to the target 3, and the S pole appeared at an area of the die farther from the target 3. The dies to which the magnet was attracted were held by the object holder 13 while a current is carried. A 200V DC voltage was applied to the object holder 13 in the reduced pressure container 3. The reduced pressure container 3 was evacuated to about $10^{-8}$ Torr and was under argon (the auxiliary gas G2) atmosphere. The high frequency electricity applied to the carbon target had an output of 700 W at a frequency of 13.56 MHz. A magnetic field lens was 210 mT samarium cobalt ring magnet having an outside diameter of 42 mm, an inside diameter of 34 mm and a height of 8 mm and was disposed in the thickness direction.

Under the state, the thin-film formation was carried out such that an intermediate layer was formed on the surface of each object 101 for 22 minutes, and a main layer was formed thereon for 136 minutes. The thin-film formed in the dies taken out was as follows:

1) The thin-film was formed on the surface of each die facing to the target as well as an inner wall (4 mm) of each through hole to a substantially same depth (i.e., 4 mm deeper from the surface of each die).
2) The surface of each die and the area of each inner wall where the film was formed corresponded to an area for actually drawing a cup-shaped member such as a male snap button (an area where each die slides on a molding material). It was therefore found that the present invention was very effective at least to form a thin-film on a drawing die.
3) In the peripheral wall of each through hole, the area underneath the formed film (the area where no thin-film was formed) configured to reverse a tapered area that is not contacted with the molding material. Accordingly, no thin-film formation did not constitute a disadvantage to form a thin-film on this kind of die.

A thickness of the thin-film formed was about 400 nm, and will have an estimated Vickers hardness of 3500 HV based on past measurement results. The dies were used to press the snap buttons for 100,000 times. There was no peel at all.

Modification Example of Present Embodiment

Figure 2:
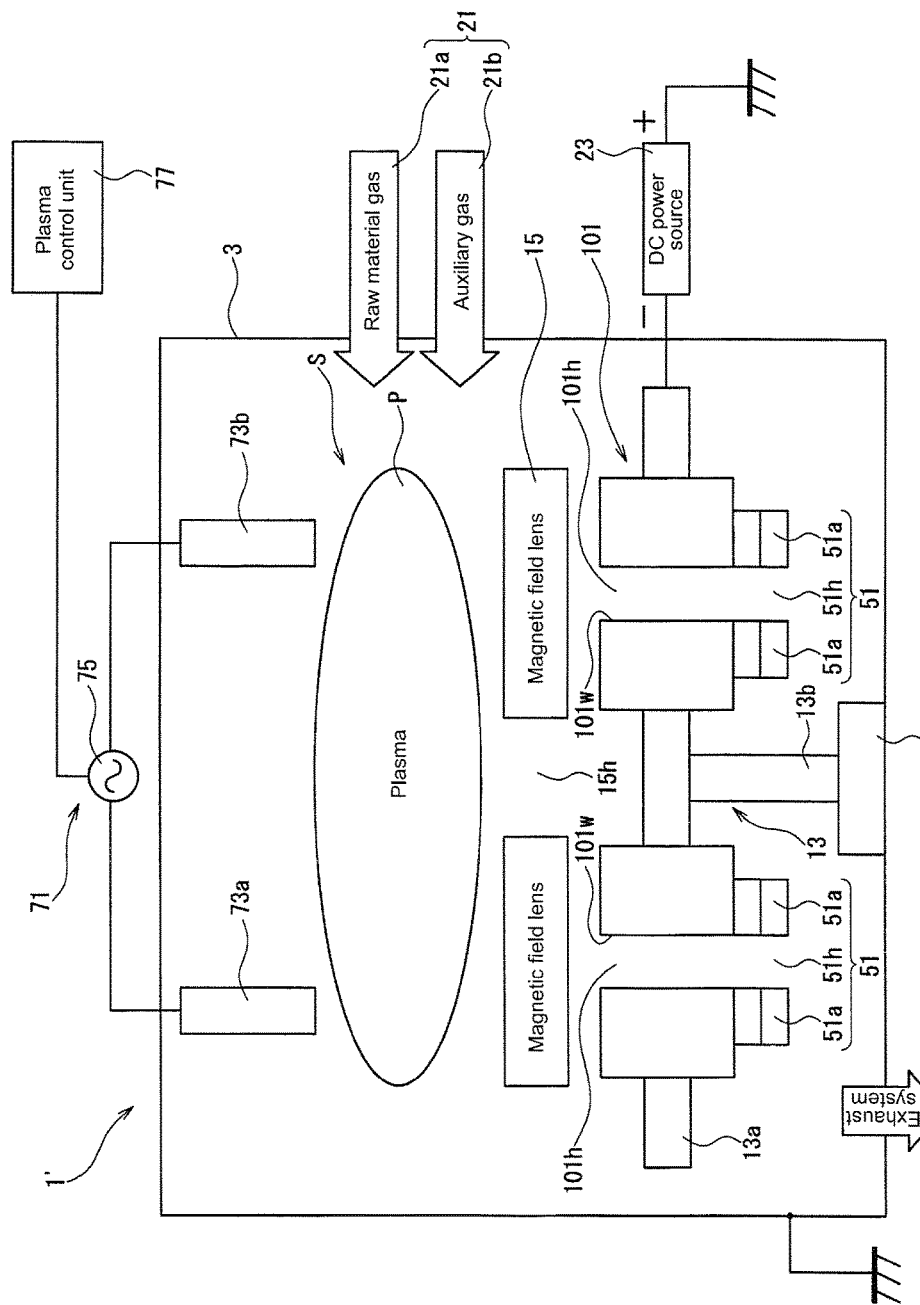
FIG. 2 A front schematic view illustrating a configuration of a thin-film formation device according to a modification example of the present embodiment.

Referring to FIG. 2, a modification example of the present embodiment will be described. A thin-film formation device 1 shown in FIG. 2 has the same basic structure as the thin-film formation device 1 according to the present embodiment as described above except the configuration of the plasma generation means. In the following description, the configuration of the plasma generation means will be mainly described. Other members are simply added the same symbols used in FIG. 1, and the description there of is omitted to the extent possible.

A plasma generation means 71 is configured of dipole electrodes (symmetric electrodes) including an electrode 73a and an electrode 73b that are disposed within the reduced pressure container 3 and are insulated from the reduced pressure container 3, a high frequency power source 75 for feeding high frequency electricity to the electrode 73a and the electrode 73b, and a plasma control unit 77 for controlling generation of plasma P by controlling the high frequency power source 75. The high frequency power source 75 and the plasma control unit 77 are desirably housed within a shield case (not shown) in order to prevent adverse effects by harmonic waves. To the reduced pressure container 3, the raw material gas G1 (hydrocarbon-based gas such as methane ($CH_4$)) is fed from a raw material gas feed means 21a configuring the gas feed means 21, and the auxiliary gas G2 (argon, oxygen, nitrogen, xenon etc.) is fed from an auxiliary gas feed means 21b.

By an operation of the plasma generation means 71, the raw material gas G1 is plasmanized under the auxiliary gas G2 atmosphere and the plasma P is generated within an ionizing space S. Other configurations and function effects are the same as those of the present embodiment.

DESCRIPTION OF SYMBOLS 1 thin-film formation device
3 reduced pressure container
5 target
7 sputtering light source
9 gas feed means
10 plasma generation means
11 ionizing mechanism
11 high frequency power source
13 object holder
15 magnetic field lens
21 gas feed means
21a raw material gas feed means
21b auxiliary gas feed means
22 insulator
23 DC power source
31 exhaust system
41, 71 plasma generation means
51 magnet mechanism
101 object to be processed
J magnetic field line
P plasma
S raw material gas feed space

The invention claimed is:
1. A thin-film formation device comprising:
a reduced pressure container having an exhaust system;
a raw material gas feed line for feeding a raw material gas containing components for forming a thin-film to be intended into the reduced pressure container;
an object holder disposed in the reduced pressure container, the object holder being capable of holding an object to be processed;

a plasma generation mechanism for generating plasma from the raw material gas fed from the raw material gas feed line, the plasma generation mechanism having a high frequency electrode;

a magnetic field lens disposed between the high frequency electrode and the object holder in the reduced pressure container, the magnetic field lens being configured to accelerate ionized particles in the plasma toward the object; and a magnetic field generation mechanism including a first ring-shaped permanent magnet or a first electromagnet attached to the object, the first ring-shaped permanent magnet or the first electromagnet being configured to magnetize the object for converging a flux of the plasma to the object.

2. The thin-film formation device according to claim 1, wherein the first ring-shaped permanent magnet or the first electromagnet is disposed at at least either of the feed side of the raw material gas at the object and the rear side of the desired area at the object.

3. The thin-film formation device according to claim 1, wherein the magnetic field lens includes a second ring-shaped permanent magnet or a second electromagnet disposed facing the object in the reduced pressure container.

* * * * *